(12) United States Patent
Sakai et al.

(10) Patent No.: US 7,700,940 B2
(45) Date of Patent: Apr. 20, 2010

(54) GALLIUM NITRIDE-BASED COMPOUND SEMICONDUCTOR DEVICE

(75) Inventors: Shiro Sakai, Tokushima (JP); Tomoya Sugahara, Tokushima (JP)

(73) Assignee: Nitride Semiconductor Co., Ltd., Tokushima (JP)

( * ) Notice: Subject to any disclaimer, the term of this patent is extended or adjusted under 35 U.S.C. 154(b) by 410 days.

(21) Appl. No.: 10/521,544

(22) PCT Filed: Jul. 1, 2003

(86) PCT No.: PCT/JP03/08365

§ 371 (c)(1),
(2), (4) Date: Jan. 14, 2005

(87) PCT Pub. No.: WO2004/008551

PCT Pub. Date: Jan. 22, 2004

(65) Prior Publication Data

US 2005/0236642 A1     Oct. 27, 2005

(30) Foreign Application Priority Data

Jul. 16, 2002  (JP) .............................. 2002-206581

(51) Int. Cl.
*H01L 33/00* (2006.01)
(52) U.S. Cl. ................. 257/14; 257/E33.028
(58) Field of Classification Search ............ 255/183, 255/184; 257/79, 86, 97, 101, 102, 103, 257/190, 191, 613, 615, 12, 13, 14, 15, 16, 257/17, 18, 19, E33.001, E33.002, E33.013, 257/E33.023, E33.026, E33.028
See application file for complete search history.

(56) References Cited

U.S. PATENT DOCUMENTS 4,992,837 A * 2/1991 Sakai et al. .................... 257/13
5,543,638 A * 8/1996 Nettelbladt et al. ........... 257/98

(Continued)

FOREIGN PATENT DOCUMENTS

JP           10-51074 A      2/1998

(Continued)

OTHER PUBLICATIONS

English Abstract of JP11-243251; 1 page.

(Continued)

*Primary Examiner*—Sue Purvis
*Assistant Examiner*—Kevin Quinto
(74) *Attorney, Agent, or Firm*—Osha • Liang LLP

(57) ABSTRACT

An LED emitting light of wavelength mainly 375 nm or below. The LED includes a GaN layer (16), an n-clad layer (20), an AlInGaN buffer layer (22), a light emitting layer (24), a p-clad layer (26), a p-electrode (30), and an n-electrode (32) arranged on a substrate (10). The light emitting layer (24) has a multi-layer quantum well structure (MQW) in which an InGaN well layer and an AlInGaN barrier layer are superimposed. The quantum well structure increases the effective band gap of the InGaN well layer and reduces the light emitting wavelength. Moreover, by using the AlInGaN buffer layer (22) as the underlying layer of the light emitting layer (24), it is possible to effectively inject electrons into the light emitting layer (24), thereby increasing the light emitting efficiency.

12 Claims, 3 Drawing Sheets

U.S. PATENT DOCUMENTS

| | | | | |
|---|---|---|---|---|
| 5,684,309 | A | * | 11/1997 | McIntosh et al. ............ 257/191 |
| 5,851,905 | A | * | 12/1998 | McIntosh et al. ............ 438/492 |
| 6,441,403 | B1 | * | 8/2002 | Chang et al. ................. 257/94 |
| 6,489,636 | B1 | * | 12/2002 | Goetz et al. |
| 2002/0093020 | A1 | * | 7/2002 | Edmond et al. ............... 257/79 |
| 2002/0195619 | A1 | * | 12/2002 | Makimoto et al. .......... 257/197 |
| 2003/0047744 | A1 | * | 3/2003 | Yanamoto .................... 257/98 |
| 2006/0175600 | A1 | * | 8/2006 | Sato et al. ..................... 257/14 |

FOREIGN PATENT DOCUMENTS

| | | |
|---|---|---|
| JP | 10-270756 A | 10/1998 |
| JP | 10-303458 A | 11/1998 |
| JP | 11-243251 | 9/1999 |
| JP | 11-251684 A | 9/1999 |
| JP | 2000-232259 A | 8/2000 |
| JP | 2000-315838 A | 11/2000 |
| JP | 2001-345478 A | 5/2003 |

OTHER PUBLICATIONS

Taiwan Patent Application: Notice for Grounds for Rejection; Applicant: Nitride Semiconductors Co., Ltd.; Dated Oct. 11, 2005; Taiwanese version (2 pages); English Translation (2 pages).

esp@cenet—Document Biblliography and Abstract for Japanese Patent No. 10-270756, published on Oct. 9, 1998 (1 page).

esp@cenet—Document Biblliography and Abstract for Japanese Patent No. 2000-232259, published on Aug. 22, 2000 (1 page).

esp@cenet—Document Biblliography and Abstract for Japanese Patent No. 10-051074, published on Feb. 20, 1998 (1 page).

esp@cenet—Document Biblliography and Abstract for Japanese Patent No. 10-303458, published on Nov. 13, 1998 (1 page).

esp@cenet—Document Biblliography and Abstract for Japanese Patent No. 2000-315838, published on Nov. 14, 2000 (1 page).

esp@cenet—Document Biblliography and Abstract for U.S. Publication No. 2003094618, published on May 22, 2003 (related to Japanese Patent No. 2001-345478) (1 page).

Final Office Action issued Mar. 6, 2006 for corresponding Taiwan Patent Application No. 092119118 (with English translation), 5 pages.

European Search Report issued on Oct. 6, 2006 for corresponding European Patent Application No. 03738612.5-2222, PCT/JP0308365, 2 pages.

Mary H. Crawford, et al. Design and Performance of Nitride-based UV LEDs, vol. 3938, 2000, pp. 13-23, XP008060093 (cited in European Search Report), 11 pages.

M. Shatalov, et al. Band-edge luminescnce in quaternary AlInGaN light-emitting diodes, vol. 78, No. 6, Feb. 5, 2001, pp. 817-819, XP012028574 (cited in European Search Report), 3 pages.

Office Action dated Jan. 9, 2007 issued by the European Patent Office in European Application No. 03 738 612.5-1235, 4 pages.

Chinese Office Action for Chinese Application No. 03816873.1 issued on Jan. 26, 2007, and English translation thereof, 14 pages.

English Patent Abstract of JP11251684 from esp@cenet, published Sep. 17, 1999, 1 page.

Office Action in Chinese Patent Application No. 03816873.1 with English translation, mailed Aug. 24, 2007, 13 pages.

\* cited by examiner

GALLIUM NITRIDE-BASED COMPOUND SEMICONDUCTOR DEVICE

TECHNICAL FIELD

The present invention relates to a gallium nitride (GaN)-based compound semiconductor device and, in particular, to a structure of a light emitting element which primarily emits light in a wavelength band of approximately 375 nm or shorter.

BACKGROUND ART

LEDs having an InGaN light emitting layer and a wavelength band of 375 nm-600 nm have been developed. In $In_xGa_{1-x}N$, the wavelength of emitted light varies when the proportion x of In is changed. More specifically, as the composition x of In is increased, the light emission wavelength is shifted toward a longer wavelength side, from 363 nm when x=0 (GaN) to 600 nm when x=1 (InN).

Recently, there have been active efforts to develop LEDs having a short wavelength of 375 nm or shorter or having an ultraviolet (UV) wavelength. Demand for such short wavelength LEDs is very strong as the short wavelength LEDs allow applications in, for example, a white light source in which the LED is combined with a fluorescent material or sterilization using the sterilizing characteristic of the LED. However, in an LED having an InGaN light emitting layer, in order to obtain a light emission wavelength of 375 nm or shorter, the composition x of In must be very small, resulting in a reduced fluctuation of In composition and, consequently, significant reduction in a light emission efficiency. In addition, fundamentally, when InGaN is used as the light emitting layer, light emission of wavelength of 363 nm or shorter cannot be achieved.

DISCLOSURE OF INVENTION

An object of the present invention is to provide a GaN-based compound semiconductor device having a superior light emission efficiency primarily in a wavelength band of 375 nm or shorter.

According to one aspect of the present invention, there is provided a gallium nitride-based compound semiconductor device comprising a GaN-based light emitting layer formed above a substrate, wherein the light emitting layer comprises a multilayer quantum well layer (MQW) in which an InGaN well layer and an AlInGaN barrier layer are layered. A band gap of the AlInGaN barrier layer is wider than a band gap of InGaN, and an effective band gap of the InGaN well layer is widened so that the light emission wavelength is shortened. In addition, by using AlInGaN as a barrier layer, a lattice mismatch between the AlInGaN barrier layer and the InGaN well layer is reduced, resulting in reduction in distortion and improvement in light emission efficiency.

According to another aspect of the present invention, it is preferable that, in the gallium nitride-based compound semiconductor device, a compositional ratio of In in the InGaN well layer is, for example, 5% or greater and 15% or smaller. According to another aspect of the present invention, it is preferable that, in the gallium nitride-based compound semiconductor device, a thickness of the InGaN well layer is, for example, 1 nm or greater and 2 nm or smaller.

According to another aspect of the present invention, it is preferable that, in the gallium nitride-based compound semiconductor device, a compositional ratio of Al in the AlInGaN barrier layer is, for example, 14% or greater and 40% or smaller and a compositional ratio of In in the AlInGaN barrier layer is, for example, 0.1% or greater and 5% or smaller.

According to another aspect of the present invention, it is preferable that the gallium nitride-based compound semiconductor device further comprises an AlInGaN buffer layer adjacent to the light emitting layer. By providing an AlInGaN buffer layer adjacent to the light emitting layer, it is possible to efficiently supply carriers into the light emitting layer and improve the light emission efficiency.

According to another aspect of the present invention, it is preferable that, in the gallium nitride-based compound semiconductor device, a compositional ratio of Al in the AlInGaN buffer layer is, for example, 0.5% or greater and 40% or smaller and a compositional ratio of In in the AlInGaN buffer layer is, for example, 0.1% or greater and 5% or smaller.

BEST MODE FOR CARRYING OUT THE INVENTION

Figure 1:
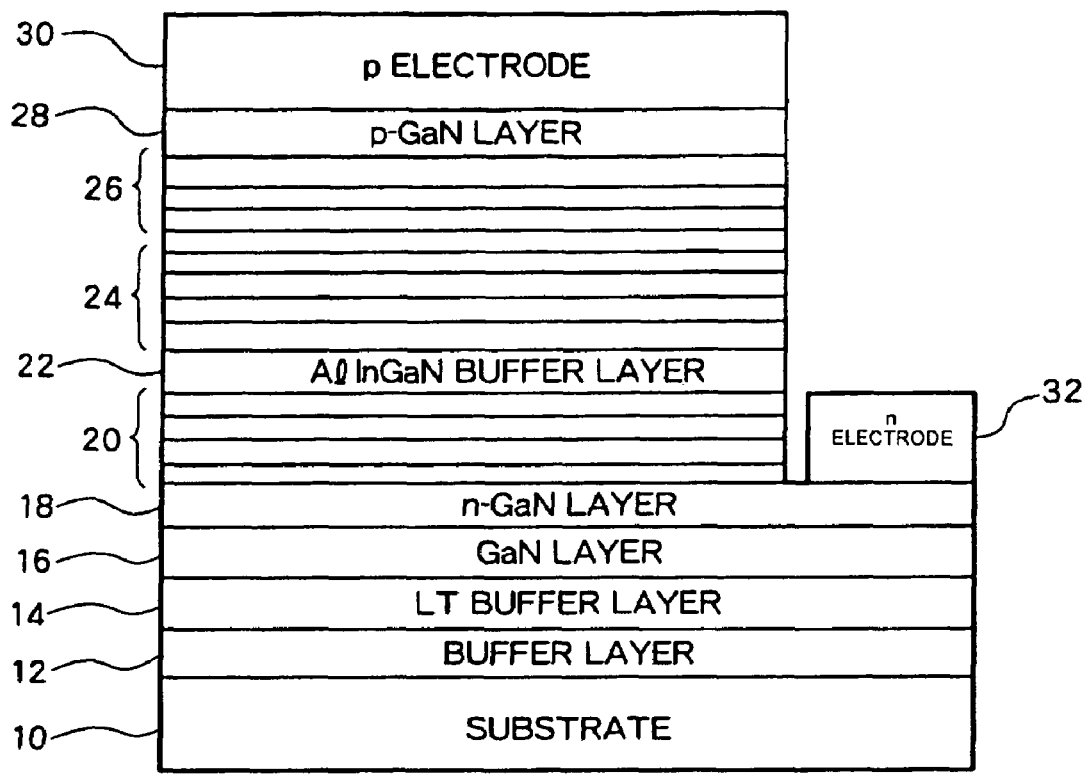
FIG. 1 is a diagram showing a structure of an LED according to a preferred embodiment of the present invention.

A preferred embodiment of the present invention will now be described referring to the drawings and exemplifying a light emitting element, in particular, an LED, as a semiconductor device.

FIG. 1 shows a structure of an LED according to a preferred embodiment of the present invention. An SiN buffer layer 12, a low temperature (LT) grown buffer layer 14, and an undoped GaN layer 16 are sequentially formed on a substrate 10 which is made of, for example, sapphire. These layers are provided in order to reduce dislocations. An n-GaN layer 18 for reducing an operation voltage is formed on the undoped GaN layer 16. An SLS (strained layer Superlattice) in which a GaN and AlGaN are alternately layered (n-GaN/n-AlGaN) is formed on the n-GaN layer 18 as an n-clad layer 20. An AlInGaN buffer layer 22 and a light emitting layer 24 are formed on the n-clad layer 20. As will be described below, the light emitting layer 24 comprises a multilayer quantum well (MQW) in which an InGaN well layer and an AlInGaN barrier layer are layered. An SLS layer in which GaN and AlGaN are layered (p-GaN/p-AlGaN) is formed on the light emitting layer 24 as a p-clad layer 26. In other words, the LED according to the present embodiment has a structure in which the AlInGaN buffer layer 22 and the MQW light emitting layer 24 are sandwiched between the n-clad layer 20 and the p-clad layer 26. A p-GaN layer 28 for reducing an operation voltage is formed on the p-clad layer 26 and a p electrode 30 is formed on the p-GaN layer 28. A portion of the n-GaN layer 18 is exposed and an n electrode 32 is formed on the exposed region. Each layer is formed using an MOCVD method employing an MOCVD device.

In the related art, InGaN or the like is employed as the light emitting layer 24. In the present embodiment, however, a multilayer quantum well MQW in which an InGaN well layer and an AlInGaN barrier layer are alternately layered is used as the light emitting layer 24. In addition, the AlInGaN buffer layer 22 is formed adjacent to the light emitting layer 24 when the light emitting layer 24 is sandwiched between the n-clad layer 20 and the p-clad layer 26.

The light emitting layer 24 and the buffer layer 22 will now be described.

Figure 2:
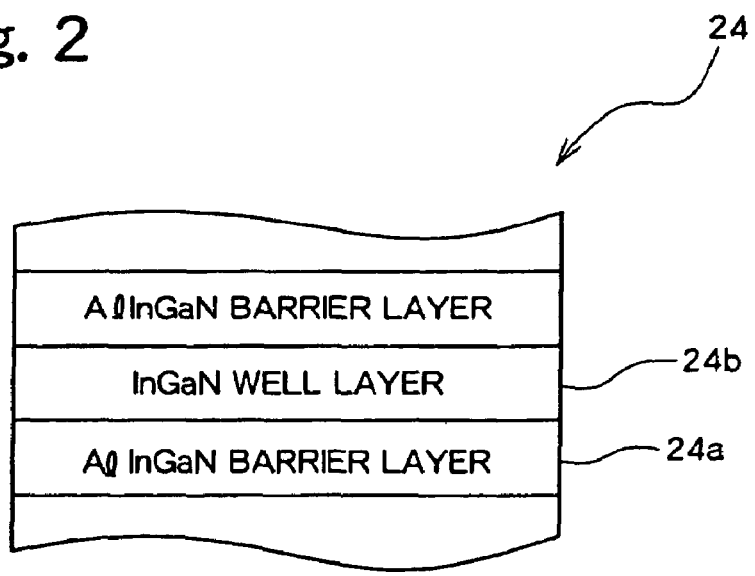
FIG. 2 is a diagram showing a detailed structure of a light emitting layer in FIG. 1.

FIG. 2 shows a structure of the light emitting layer 24 of FIG. 1. The light emitting layer 24 is formed by alternately layering an InGaN well layer 24b and an $Al_xIn_yGa_{1-x-y}N$ barrier layer 24a. Here, x and y are in the ranges of $0<x<1$ and $0<y<1$. The thickness of the InGaN well layer 24 is, for example, 1.5 nm and the thickness of the AlInGaN barrier layer 24a is, for example, 12 nm. The pattern is repeated, for example, 7 times, for a total of 14 layers. A band gap of the AlInGaN barrier layer 24a is wider than a band gap of the InGaN well layer 24b. When a forward bias is applied to the p electrode 30 and the n electrode 32, electrons and holes combine in the InGaN well layer 24b and light is emitted. When a single layer of InGaN layer is employed, it is fundamentally impossible to realize a light emission of a wavelength of 363 nm or shorter. By employing the MQW structure in which the well layer and the barrier layer are alternately layered, it is possible to widen an effective band gap of the InGaN well layer 24b. With the widening of the effective band gap, light emission at a wavelength of 363 nm or shorter can be enabled. Because a composition of In in the InGaN well layer 24b which is the light emitting region is relatively high (for example, composition x of In =10%) and fluctuation in In composition in the InGaN well layer 24b is large, the light emission efficiency is high. More specifically, when there is a spatial fluctuation in the composition, carriers are localized and the light emission efficiency tends not to be reduced even when dislocations are created in InGaN.

In addition, because the $Al_xIn_yGa_{1-x-y}N$ barrier layer 24a also contains In (y>0), fluctuation in composition of In occurs. Thus, similar to the well layer 24b, carriers are localized in the barrier layer 24a, resulting in inhibition of reduction in the light emission efficiency regardless of the presence of dislocations. Upon comparison between the AlInGaN barrier layer 24a and an AlGaN barrier layer which does not contain In, it can be seen that AlInGaN barrier layer 24a has advantages that a lattice mismatch with the InGaN well layer 24b is small, lattice mismatch dislocations tend not to occur, and crystallinity is high. Even when dislocations do not occur, with AlInGaN, distortions generated between the well layer 24b and the barrier layer 24a can be reduced. When these layers are c-plane grown and a compression stress or a tensile stress is applied within the plane, an electric field is generated along a c-axis direction in a hexagonal crystal nitride semiconductor because of the piezoelectric characteristic. The generated electric field functions to move the electron-hole pair supplied into the well layer 24b in opposite directions and reduces a spatial overlap of the wave functions of the electrons and holes, resulting in a reduction in a rate of recombination. In other words, the light emission efficiency is reduced when there is a distortion in the well layer 24b. This effect (quantum-confined Stark effect) is particularly significant when the well layer 24b is wide, but may also affect the well layer 24b when the well layer 24b is narrow. In the present embodiment, AlInGaN is used as the barrier layer 24a to reduce the lattice mismatch and inhibit the distortion of the well layer 24b. Because of this configuration, a reduction in the light emission efficiency due to the quantum-confined Stark effect can be inhibited.

In this manner, by forming the InGaN well layer 24b thinly in the light emitting layer 24 and widening the band gap of the AlInGaN barrier layer 24a in the light emitting layer 24, the effective band gap of the InGaN well layer 24b can be widened through quantum effects such that a light emission wavelength of 360 nm or shorter can be realized. In this respect, the LED of the present embodiment fundamentally differs from, for example, an LED which uses AlInGaN as a light emitting layer in place of InGaN and which has a wavelength of 380 nm or shorter.

In an LED having a light emitting layer with InGaN as the light emitting layer, the light emission efficiency is reduced when a thickness of the InGaN layer is 2 nm or smaller because the wave functions of the electrons and holes confined in the well layer leaks to the barrier (that is, outside the well) and a contribution of recombination within the barrier becomes large. In the present embodiment also, the InGaN well layer 24b must be kept at a thin thickness of 2 nm or smaller (for example, 1.5 nm) in order to cause the quantum effects, but the reduction in the light emission efficiency which occurs when the InGaN thin film is used as the light emitting layer does not occur in the light emitting layer 24 of the present embodiment. Because AlInGaN is used as the barrier layer 24a, the band gap of the InGaN well layer 24b is effectively widened and leak of the wave functions to the barrier layer 24a is reduced.

Because AlInGaN used in the barrier layer 24a contains Al, the growth temperature of AlInGaN must be a temperature (for example, 800° C.) which is higher than a growth temperature of InGaN (650° C.-750° C.). In this manner, by growing the layer at a temperature of 750° C. or higher, the crystallinity of the barrier layer 24a is also increased.

The buffer layer 22, on the other hand, is formed by AlInGaN. Because the buffer layer 22 contains Al, the band gap is widened to a width which is larger than that of the well layer 24b which is InGaN. Using the layer 22, efficiency of supply of electrons into the well layer 24b is improved and an amount of supply of holes to the buffer layer 22 is reduced so that the electrons and holes are efficiently confined within the well layer 24b. An Al composition of the buffer layer 22 may be set, for example, to approximately 40%.

A method of manufacturing the LED shown in FIGS. 1 and 2 will now be described in detail. The LED of the present embodiment is manufactured through the following processes. In an MOCVD device under a normal pressure, a sapphire c-plane substrate 10 is placed on a susceptor in a reaction tube and a thermal treatment is applied in a hydrogen atmosphere for 10 minutes at a temperature of 1100° C. Then, the temperature is reduced to 500° C. Monomethyl silane gas and ammonia gas are introduced from gas introduction tubes for 100 seconds and an SiN buffer layer 12 is grown on the substrate 10 in a discontinuous manner (or in an island-like manner). Then, a GaN buffer layer (LT buffer layer) 14 is grown at the same temperature to a thickness of 25 nm by supplying trimethyl gallium and ammonia gas through the gas introduction tubes. The temperature is then raised to 1075° C., trimethyl gallium and ammonia gas are again supplied to grow an undoped GaN layer 16 to a thickness of 2 μm. Next, an Si-doped n-GaN layer (n electrode layer) 18 to which monomethyl silane gas is added is grown to a thickness of 1.0 μm. A carrier density within the n-GaN layer 18 is approximately $5 \times 10^{18}$ cm$^{-3}$.

Then, 50 pairs of Si-doped n-$Al_{0.01}Ga_{0.9}N$ (2 nm) and Si-doped n-GaN (2 nm) are grown at the same temperature to form an SLS structure and grow then-clad layer 20. As a material for Al, trimethylaluminum (TMA) is used. An average electron density of the n-clad layer 20 is $5 \times 10^{18}$ cm$^{-3}$. Then, the temperature is raised to approximately 800° C. and an undoped $Al_{0.05}In_{0.1}Ga_{0.94}N$ buffer layer 22 is grown. A thickness of the buffer layer 22 is 36 nm. Because the growth temperature is low and 800° C., the resistivity is high. After the AlInGaN buffer layer 22 is grown, 7 pairs of undoped $In_{0.1}Ga_{0.9}N$ (1.5 nm) and an undoped $Al_{0.2}In_{0.1}Ga_{0.7}N$ (95 nm) are grown at the same temperature of 800° C. to grow the MQW light emitting layer 24. A total thickness of the light emitting layer is 95 nm.

Then, the temperature is raised to 975° C. and 50 periods of Mg-doped p-$Al_{0.1}Ga_{0.9}N$ (2 nm) and Mg-doped p-GaN (1 nm) are grown to grow the p-clad layer 26 having an SLS structure and a p-GaN layer (p electrode layer) 28 having a thickness of 20 nm is grown. Hole concentrations of the p-clad layer 26 of the SLS structure and the p-GaN layer 28 are respectively $5 \times 10^{17}$ $cm^{-3}$ and $3 \times 10^{18}$ $cm^{-3}$.

Table 1 shows structures, compositions, thicknesses, and growth temperatures of the layers.

emitted form the LED device was measured. The light power was approximately 1.6 mW at a supplied current of 20 mA. A light emission wavelength was within 360 nm±5 nm, although there was a slight variation on the wafer surface of a diameter of 2 inches.

Then, in order to confirm effects of the band gap of the AlInGaN barrier layer 24a in the light emitting layer 24, an LED device was created with only a flow rate of TMA (trimethyl aluminum) among the various gases flowing during the growth of the barrier layer 24a changed and the light emission efficiency of the LED was examined.

Figure 3:
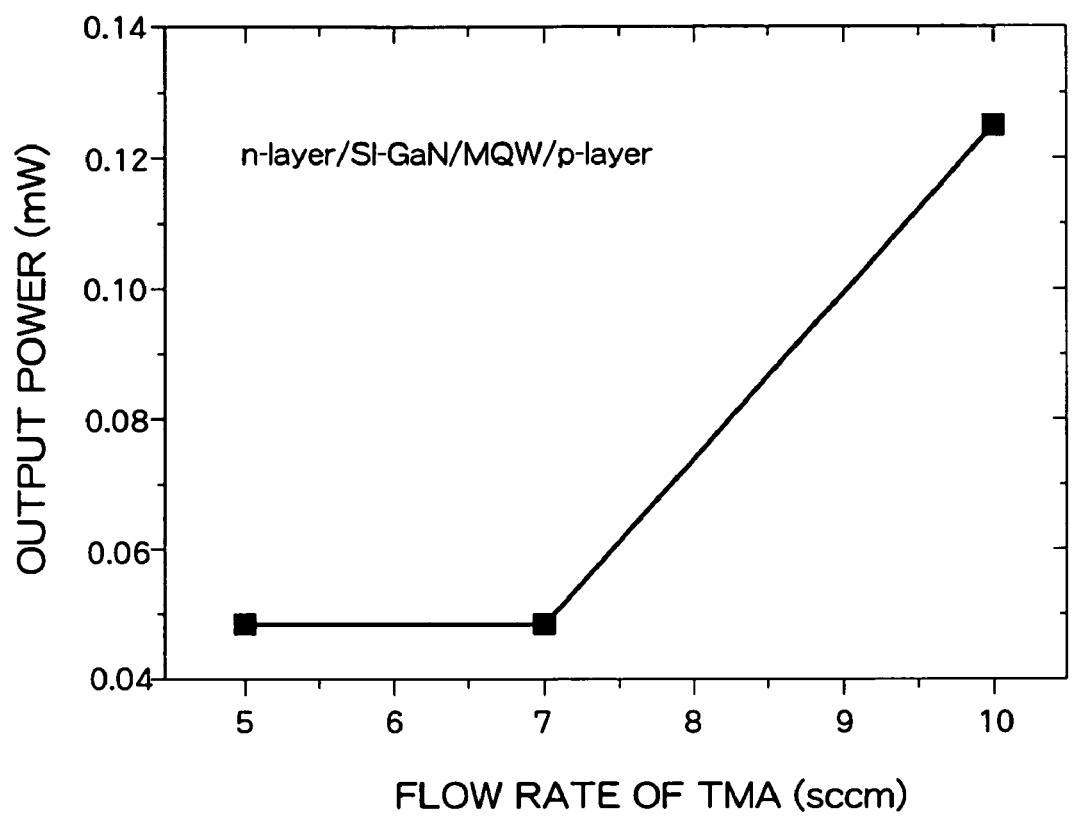
FIG. 3 is a graph showing a relationship between a flow rate of TMA through a barrier layer and an output power.

FIG. 3 shows the results of this experiment. The x-axis represents a flow rate of TMA (in sccm) during growth of the

TABLE 1

| LAYER | STRUCTURE | COMPOSITION | THICKNESS | GROWTH TEMPERATURE |
|---|---|---|---|---|
| p ELECTRODE LAYER | p+−GaN | | 20 nm | 975 |
| p CLAD LAYER | p-(GaN 1 nm/AlGaN 2 nm) 50 SLS | Al: ~10% | 150 nm | 975 |
| LIGHT EMITTING LAYER (WELL LAYER/BARRIER LAYER) | InGaN 1.5 nm/AlInGaN 12 nm 7MQW | WELL (In: ~10%), BARRIER(In: 1%, Al~20%) | 95 nm | 800 |
| BUFFER LAYER | SI-AlInGaN 36 nm | In: 1%, Al~5% | 36 nm | 800 |
| n CLAD LAYER | n-(GaN 2 nm/AlGaN 2 nm) 50 SLS | Al: ~10% | 200 nm | 1075 |
| n ELECTRODE LAYER | n-GaN | | 1 μm | 1075 |
| UNDOPED GaN LAYER | u-GaN | | 2 μm | 1075 |
| LOW TEMPERATURE GROWN BUFFER LAYER | LT-GaN | | 25 nm | 500 |
| SiN BUFFER LAYER | SiN | | | 500 |
| SUBSTRATE | SAPPHIRE | | | |

The numerical values in Table 1 are given as examples only, and other combinations of values are also possible. For example, it is possible to employ a structure in which 50 pairs of Si-doped n-$Al_{0.1}Ga_{0.9}N$ (1.6 nm) and Si-doped n-GaN (1.6 nm) are grown to form an SLS structure as the n-clad layer 20, 20 nm of $Al_{0.4}In_{0.01}Ga_{0.59}N$ is formed as the buffer layer 22, 3 pairs of $In_{0.05}Ga_{0.95}N$ quantum well layer (1.5 nm) and $Al_{0.4}In_{0.01}Ga_{0.59}N$ barrier layer (10 nm) are grown as the light emitting layer 24, and 50 pairs of Mg-doped GaN (0.76 nm) and $Al_{0.13}Ga_{0.87}N$ (1.5 nm) are formed as the p-clad layer 26. The growth temperatures for growing the layers are also exemplary, and, therefore, the buffer layer 22 and the light emitting layer 24 may alternatively be grown, for example, at a temperature of 840° C.

After the layers are sequentially grown in this manner, the wafer is taken out of the MOCVD device, Ni (10 nm) and Au (10 nm) are sequentially vacuum evaporated and formed on the surface, and a thermal treatment is applied in a nitrogen gas atmosphere containing 5% oxygen at a temperature of 520° C. to form the evaporated metal film into a p transparent electrode 30. Next, a photoresist is applied over the entire surface and an etching process for forming an n electrode is applied using the photoresist as a mask. Ti (5 nm) and Al (5 nm) are vacuum evaporated on the n-GaN layer 18 exposed through the etching process and a thermal treatment is applied in a nitrogen gas atmosphere at a temperature of 450° C. for 30 minutes to form the n electrode 32. A gold pad for wire bonding having a thickness 500 nm is formed in a portion of the p electrode 30 and the n electrode 32, a rearside of the substrate 10 is ground to a thickness of 100 μm, chips are cut through scrubbing, and the chips are mounted to obtain an LED device.

The LED device thus created was introduced into an integrating sphere, a current was supplied, and total light power barrier layer 24a and shows a flow rate of gas to be supplied to the container in a relative unit. The y-axis represents a light emission intensity in a relative unit, which is approximately ¼ of the value measured using the integrating sphere. When the flow rate of TMA was increased from 7 sccm to 10 sccm, the light emission efficiency was increased to 2.6 times the original light emission efficiency. Compositions of the barrier layer 24a grown with these conditions were approximately 1% for the compositional ratio of In and approximately 20% for the compositional ratio of Al. Because the compositional ratio of Al is approximately proportional to the flow rate of the TMA, the compositional ratio of Al in the barrier layer 24a is desirably larger than 14% (20×7 sccm/10 sccm) from the viewpoint of the light emission efficiency. On the other hand, when the compositional ratio of Al is too large, supply of current becomes difficult and the operational voltage is increased. Therefore, the compositional ratio of Al in the barrier layer 24a has its lower limit defined by the light emission efficiency and its upper limit defined by the operational voltage. Specifically, the compositional ratio of Al is preferably 14% or greater and 40% or smaller, and more preferably 16% or greater and 40% or smaller.

Regarding the compositional ratio of In in the barrier layer 24a, because the band gap is narrowed as the compositional ratio of In increases, the compositional ratio of In is preferably a small value. However, when the compositional ratio of In is zero, the light emission efficiency is drastically reduced. This may be considered as due to fluctuations in composition of In occurring within the barrier layer 24a which contributes to improvement in the light emission efficiency. Therefore, the compositional ratio of In in the barrier layer 24a has a lower limit defined by the amount of compositional fluctuation and its upper limit defined by the band gap. Specifically, the compositional ratio of In is preferably 0.1% or greater and 5% or smaller and more preferably 0.1% or greater and 3% or smaller. Example of compositions of the barrier layer 24a is $Al_{0.4}In_{0.01}Ga_{0.59}N$ having a compositional ratio of Al of 40% and a compositional ratio of In of 1%.

When the compositional ratio of In in the well layer 24b is too small, a fluctuation in In composition becomes too small and the light emission efficiency is reduced. When, on the other hand, the compositional ratio of In in the well layer 24b is too large, the light emission wavelength is shifted towards a longer wavelength side. Therefore, an optimum compositional ratio of In is determined based on the desired light emission wavelength and the thickness of the well layer 24b. For example, when the light emission wavelength is 360 nm, the compositional ratio of In in the well layer 24b is preferably 5% or greater and 15% or smaller, and more preferably 5% or greater and 13% or smaller. An example of compositions of the well layer 24b is $In_{0.05}Ga_{0.95}N$ having a compositional ratio of In of 5%. The thickness is preferably 1 nm or greater and 2 nm or smaller in order to realize the quantum effect and is more preferably 1.3 nm or greater and 1.8 nm or smaller. The present inventors have confirmed that, when the thickness of the well layer 24b is 3 nm or greater, the light emission wavelength is 400 nm. The grown temperature of the well layer 24b and the barrier layer 24a is preferably 750° C. or greater as described above, and is more preferably 770° C. or greater (for example, 800° C.).

Next, the flow rate of TMA to be supplied during the growth of the barrier layer 24a in the light emitting layer 24 was fixed at 10 sccm while the flow rate of TMA to be supplied during the growth of the AlInGaN buffer layer 22 was varied, and changes in the light emission efficiency were measured.

Figure 4:
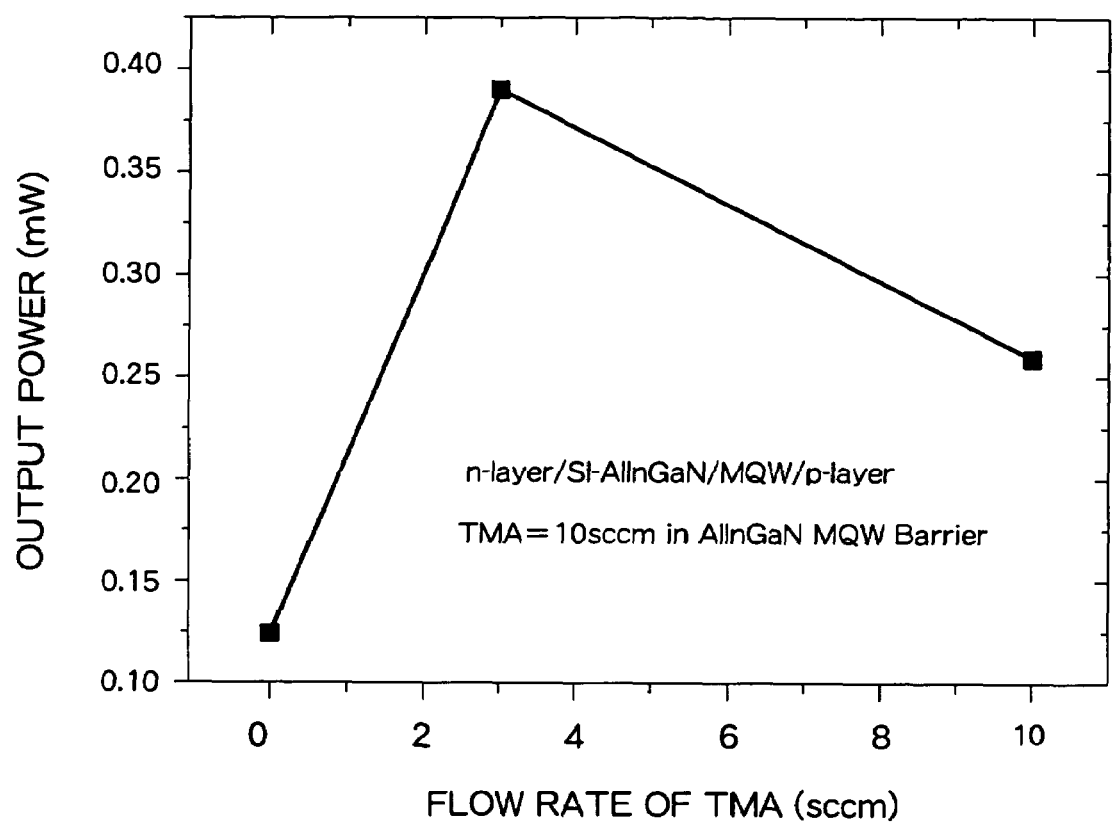
FIG. 4 is a graph showing a relationship between a flow rate of TMA through a buffer layer and an output power.

FIG. 4 shows the results of this experiment. In FIG. 4, the x-axis represents a flow rate of TMA in a relative unit. The y-axis represents an output power in a relative unit. When the flow rate of TMA was increased, the compositional ratio of Al in the buffer layer 22 was increased. When the flow rate of TAM was increased from zero to 3 sccm, the light emission intensity was increased to 2.7 times the original light emission intensity. When the flow rate of TMA was increased to 10 sccm, the light emission intensity was reduced. The light emission intensity was low when the flow rate of TMA was zero because the band gap of the buffer layer 22 is narrow (because the compositional ratio of Al is 0) and, consequently, electrons cannot be effectively supplied from the buffer layer 22 to the light emitting layer 24. Alternatively, it is possible to consider the reason for the light emission intensity being low when the flow rate of TMA is zero to be that the holes leak to the buffer layer 22 and the confinement of holes within the well layer 24b is insufficient. The light emission efficiency is reduced also when the compositional ratio of Al is too large because the crystallinity is reduced and the band gap of the layer is too widened, resulting in reduction in the tendency for the electrons to be supplied from the n-clad layer 20.

Therefore, the compositional ratio of Al in the AlInGaN buffer layer 22 is preferably 0.5% or greater and 40% or smaller, and is more preferably 1% or greater and 40% or smaller. Regarding the compositional ratio of In in the AlInGaN buffer layer 22, the present inventors confirmed that the light emission efficiency is drastically reduced when the compositional ratio of In is zero. It can be considered that this phenomenon is due to fluctuations in composition of In occurring in the buffer layer 22 which contributes to improvement in the light emission efficiency. Therefore, the compositional ratio of In in the AlInGaN buffer layer 22 is preferably 0.1% or greater and 5% or smaller, and is more preferably 0.1% or greater and 3% or smaller. An example of compositions of the AlInGaN buffer layer 22 is $Al_{0.4}In_{0.01}Ga_{0.59}N$ having a compositional ratio of Al of 40% and a compositional ratio of In of 1%.

As described, in the present embodiment, a multilayer quantum well structure in which an InGaN well and an AlInGaN barrier layer having predetermined compositional ranges are alternately layered is employed as the light emitting layer 24 to widen the effective band gap of InGaN and allow light emission of 340 nm-375 nm. In addition, AlInGaN is used as the barrier layer in order to improve the light emission efficiency and an AlInGaN buffer layer 22 having predetermined compositions is provided adjacent to the light emitting layer so that carriers can be effectively injected and the light emission efficiency is improved.

A preferred embodiment of the present invention has been described. The present invention, however, is not limited to the preferred embodiment and various modifications may be made.

For example, in the preferred embodiment, an SiN buffer layer 12 is formed. However, this SiN buffer layer 12 is provided for inhibiting dislocations and may be omitted as necessary.

Alternatively, it is also possible to replace the SiN buffer layer 12 and the low temperature (LT) grown buffer layer 14 by a low temperature grown GaNP buffer layer.

The invention claimed is:

1. A gallium nitride (GaN)-based compound semiconductor device, comprising:
   a GaN-based light emitting member;
   a buffer layer adjacent to the light emitting member; and
   a strained layer superlattice (SLS) clad layer,
   wherein the light emitting member comprises a multilayer quantum well structure including an InGaN well layer and an AlInGaN barrier layer,
   wherein a compositional ratio of Al in the AlInGaN barrier layer is 14% or greater and 40% or smaller, and a compositional ratio of In in the AlInGaN barrier layer is 0.1% or greater and 5% or smaller,
   wherein the GaN-based light emitting member emits ultraviolet light having a wavelength of 375 nm or shorter,
   wherein the multilayer comprises at least two of the InGaN well layers and two of the AlInGaN barrier layers, in which the InGaN well layers and AlInGaN barrier layers are alternately layered, and
   wherein a thickness of each of the InGaN well layer is 1 nm or greater and 2 nm or smaller.

2. The GaN-based compound semiconductor device according to claim 1, wherein a compositional ratio of In in the InGaN well layer is 5% or greater and 15% or smaller.

3. The GaN-based compound semiconductor device according to claim 1, wherein a compositional ratio of In in the InGaN well layer is 5% or greater and 13% or smaller.

4. The GaN-based compound semiconductor device according to claim 1, wherein the thickness of the InGaN well layer is between 1.3 nm and 1.8 nm.

5. The GaN-based compound semiconductor device according to claim 1, wherein a compositional ratio of Al in the AlInGaN barrier layer is between 16% and 40%, and a compositional ratio of In in the AlInGaN barrier layer is between 0.1% and 3%.

6. The GaN-based compound semiconductor device according to claim 1, wherein the buffer layer adjacent to the light emitting member is an AlInGaN buffer layer.

7. The GaN-based compound semiconductor device according to claim 1, wherein the InGaN well layer and the AlInGaN barrier layer are formed at a temperature of 750 ° C. or greater.

8. The GaN-based semiconductor compound semiconductor device according to claim 1, wherein the SLS clad layer is an n-clad layer.

9. The GaN-based semiconductor compound semiconductor device according to claim 8, wherein the SLS clad layer comprises alternately layered n-GaN and n AlGaN.

10. The GaN-based semiconductor compound semiconductor device according to claim 8, further comprising a p-type SLS clad layer.

11. A gallium nitride (GaN)-based compound semiconductor device, comprising:
   a GaN-based light emitting member;
   an AlInGaN buffer layer adjacent to the light emitting member; and
   a strained layer superlattice (SLS) clad layer,
   wherein the light emitting member comprises a multilayer quantum well structure including at least one InGaN well layer and at least one AlInGaN barrier layer,
   wherein a compositional ratio of Al in the AlInGaN buffer layer is 0.5% or greater and 40% or smaller, and a compositional ratio of In in the AlInGaN buffer layer is 0.1% or greater and 5% or smaller,
   wherein a compositional ratio of Al in the AlInGaN barrier layer is 14% or greater and 40% or smaller, and a compositional ratio of In in the AlInGaN barrier layer is 0.1% or greater and 5% or smaller,
   wherein the GaN-based light emitting member emits ultraviolet light having a wavelength of 375 nm or shorter,
   wherein the multilayer comprises at least two of the InGaN well layers and two of the AlInGaN barrier layers, in which the InGaN well layers and AlInGaN barrier layers are alternately layered, and
   wherein a thickness of each of the InGaN well layer is 1 nm or greater and 2 nm or smaller.

12. The GaN-based compound semiconductor device according to claim 11, wherein a compositional ratio of Al in the AlInGaN buffer layer is between 1% and 40%, and a compositional ratio of In in the AlInGaN buffer layer is between 0.1% and 3%.

* * * * *